United States Patent [19]

Izu et al.

[11] Patent Number: 5,402,321

[45] Date of Patent: Mar. 28, 1995

[54] COMPOSITE DEVICE HAVING INDUCTOR AND COUPLING MEMBER

[75] Inventors: Toshio Izu; Kazuo Sato; Shigeyuki Doi; Hisashi Osada, all of Akita, Japan

[73] Assignee: TDK Corporation, Tokyo, Japan

[21] Appl. No.: 956,506

[22] PCT Filed: May 25, 1992

[86] PCT No.: PCT/JP92/00671

§ 371 Date: Jan. 19, 1993

§ 102(e) Date: Jan. 19, 1993

[30] Foreign Application Priority Data

| | | | |
|---|---|---|---|
| May 27, 1991 | [JP] | Japan | 3-151080 |
| May 27, 1991 | [JP] | Japan | 3-151081 |
| Jun. 12, 1991 | [JP] | Japan | 3-156552 |
| Jun. 12, 1991 | [JP] | Japan | 3-167551 |
| Jun. 12, 1991 | [JP] | Japan | 3-167553 |
| Jun. 28, 1991 | [JP] | Japan | 3-185545 |
| Jul. 11, 1991 | [JP] | Japan | 3-197202 |
| Jul. 11, 1991 | [JP] | Japan | 3-197203 |
| Jul. 19, 1991 | [JP] | Japan | 3-204828 |

[51] Int. Cl.$^6$ .................. H05K 7/02; H05K 5/00; H01F 15/02

[52] U.S. Cl. .................. 361/807; 174/52.1; 361/730; 361/811; 336/65; 336/67; 336/192

[58] Field of Search .......... 361/807, 808, 809, 810, 361/811, 728, 730, 733-734; 336/65, 66, 67, 68, 192, 185, 195; 174/52.1

[56] References Cited

U.S. PATENT DOCUMENTS

| | | | |
|---|---|---|---|
| 4,755,784 | 7/1988 | Taoka et al. | 336/65 |
| 5,003,279 | 3/1991 | Morinaga et al. | 336/192 |
| 5,015,981 | 5/1991 | Lint et al. | 361/809 |

FOREIGN PATENT DOCUMENTS

| | | |
|---|---|---|
| 56-8175 | 2/1981 | Japan . |
| 59-161010 | 9/1984 | Japan . |
| 62-80318 | 5/1987 | Japan . |
| 3-38620 | 4/1991 | Japan . |
| 3-125520 | 12/1991 | Japan . |

Primary Examiner—Bot Ledynh
Attorney, Agent, or Firm—Nakaido, Marmelstein, Murray & Oram

[57] ABSTRACT

A method of producing a composite component and a composite device which are small in size, high in the mass-production aptitude, and stable in the electrical characteristics. The composite component includes an inductor (1), coupling unit (3), and at least one circuit component (2) different from the inductor (1). The inductor (1) includes a coil support (12) having a coil winding portion (123) at the middle body thereof, and has a coil (11) wound around the coil winding portion (123). The coupling unit (3) is arranged such that one end of metal pieces (31 and 32) is fixed to one end face of the two end faces of the coil support (12) and the other ends of the metal pieces face each other across a space. The circuit component (2) is a chip component having electrodes (22 and 23) at two opposite ends of a base body (21), and is disposed between the metal pieces (31 and 32). The electrodes (22 and 23) are mounted fixedly to the metal pieces (31 and 32). A composite device is formed by combining the above-mentioned composite components with a housing. The composite component is produced by producing composite components and a housing on a lead frame, and then mounting the composite components in the housing.

14 Claims, 13 Drawing Sheets

COMPOSITE DEVICE HAVING INDUCTOR AND COUPLING MEMBER

TECHNICAL FIELD

The present invention relates to a composite component including an inductor, a composite device including at least one composite component combined with a housing, and a method of producing the composite device.

BACKGROUND ART

In producing an enductance-capacitance (LC) type composite component made up of a combination of an inductor and a capacitor for example, or a composite device including the composite component, a method generally used hitherto is to mount a discrete inductor and a discrete capacitor on a circuit board so as to provide a composite component or device and cover the whole body with an insulating coating, or otherwise, to form a capacitor by patterning electrodes on a dielectric board and mount a discrete inductor on this dielectric board so as to provide a composite component or device and then cover the whole body with an insulating coating, as described in Japanese Patent Laid-open Publication No.58(1983)-15223.

As mentioned above, since the conventional LC type composite device is of such a structure in which a discrete capacitor and a discrete inductor are mounted on a circuit board or a discrete inductor is mounted on a dielectric board having a capacitor patterned therein, the size of the device will become large in the plane direction and mounting work will become difficult.

Also, in a conventional composite device of this kind, when a plurality of inductors are mounted, the installed position or direction of the individual inductors is liable to change, so that the electrical characteristics of the device may vary. Particularly when the inductors are installed at small intervals to respond to the requirement of down-sizing of the device, a little positional change of the inductors sometimes causes a change in the electrical characteristics to an intolerable range.

Furthermore, since the conventional composite device of this kind is of such a structure that the whole body is covered with an insulating coating, it is difficult to secure a high dimensional accuracy for the external shape. If a composite component includes an inductor, depending on the way in which tile insulating coating is applied or filled, a core of the inductor may change in the electrical characteristics affected by the contraction stress of the insulating coating.

Therefore, it is an object of the present invention to provide a composite component and a composite device which have solved the above-mentioned conventional problems, which is reduced in size and suitable for mass-production, and stable in the electrical characteristics.

Another object of the present invention is to provide a method of producing with high mass-production efficiency a composite device having stable electrical characteristics, a small size, and an external configuration with high dimensional accuracy.

DISCLOSURE OF INVENTION

In order to achieve the above object, the present invention provides a composite component including an inductor, at least one circuit component different from the inductor, and coupling unit for connecting the inductor with the circuit component. The inductor has a coil support and a coil. The coil support has two opposite end portions, and a coil winding portion at the middle body thereof between the two opposite end portions. The coil is wound on the coil winding portion. The circuit component is a chip component having electrodes at both opposite end portions of the coil support. The coupling unit includes at least one pair of metal pieces. A pair of metal pieces are arranged such that one ends of the metal pieces are fixed to one of the two end portions of the coil support, and the other ends of the metal pieces face each other across a space. The circuit component is disposed between the metal pieces, and the electrodes are attached fixedly to the metal pieces.

As mentioned above, a pair of metal pieces forming the coupling unit for connecting the inductor and the circuit component such as a capacitor have one ends fixed to the end portion of the coil support and have the other ends facing each other across a space. The circuit component is disposed between the metal pieces, and the electrodes are fixed to the metal pieces. Therefore, the circuit component to be combined with the inductor can be joined with the inductor at the top surface of the inductor without using a circuit board, and as a result, a composite component small in size and with a smaller number of parts can be obtained.

The coil support as a component part of the inductor is in a bar or drum shape having two opposite ends and a coil winding portion at the middle body between the two opposite ends. A circuit component is mounted to an end face of the coil support with a pair of metal pieces. Accordingly, the composite component can be reduced to a thin and small structure to an extent of thickness substantially determined by the length in the axial direction of the coil support and the thickness of the circuit component.

The coupling unit includes at least a pair of metal pieces. The metal pieces such as these can be formed by using a lead frame, and therefore, the inductor and the circuit component can be put together on the lead frame, so that a composite component with excellent mass-production aptitude can be obtained.

The composite device according to the present invention has at least one composite component mentioned above and a housing. The housing has at least one component holding socket which is open at one face of the housing and in which the at least one composite component is inserted. Therefore, the position and the direction of the composite components are kept constant at all times by he component holding sockets. For this reason, the electrical characteristics are less liable to change owing to a change of the position or the direction of the inductors, so that substantially fixed, stable electrical characteristics can be secured. In assembling a composite device, it is only necessary to insert composite components into the component holding sockets of the housing, thus making the assembling work easy. Moreover, the external overall shape is standardized so that it is determined by the external shape of the housing, and as a result, a composite device with high dimensional accuracy can be obtained.

The producing method according to the present invention includes a composite component producing process, a housing producing process, and an assembly process. In the composite component producing process, circuit components as a part of a composite component are mounted and secured to the upside and downside of a lead frame, respectively, and then, the lead frame is subdivided in the region including the circuit components to thereby providing a discrete composite component. In the housing producing process, a housing is molded on the lead frame. In the assembly process, at least one composite component is accommodated into the housing.

Thus, in most producing processes, the lead frame is involved, which notably enhances the mass-production efficiency.

Furthermore, since in the housing the composite components are mounted, the composite components are positioned accurately. Therefore, a composite device with stable electrical characteristics and a standardized external shape with high dimensional accuracy can be produced.

BEST MODE FOR CARRYING OUT THE INVENTION

Figure 1:
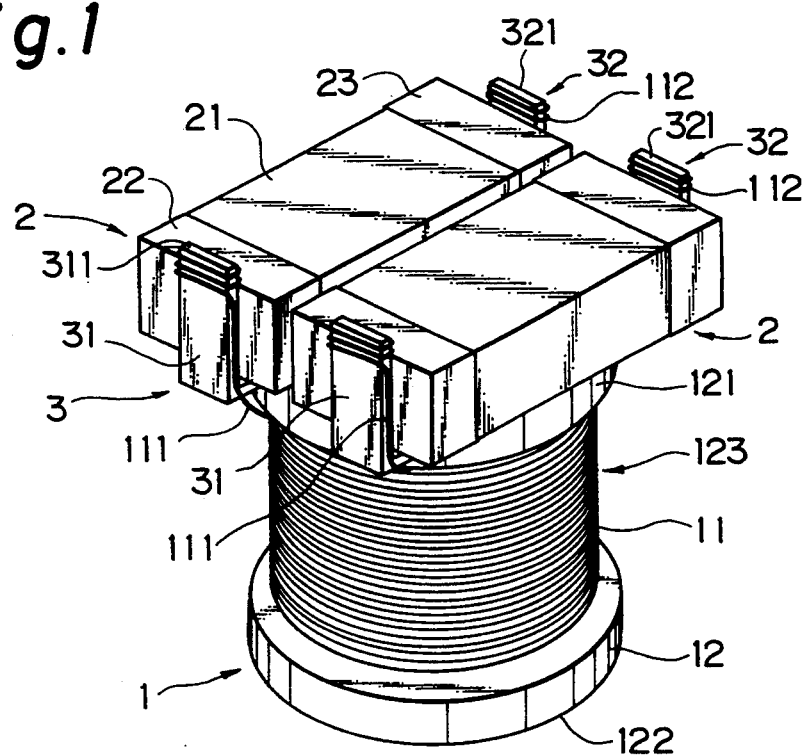
FIG. 1 is a perspective view showing an embodiment of a composite component according to the present invention.

The structure of a composite component according to the present invention will be described with reference to FIGS. 1, 2, 3, and 4. In those figures, reference numeral 1 denotes an inductor, 2 a circuit component different from the inductor 1, and 3 coupling means for connecting the inductor 1 and the circuit component 2.

The inductor 1 is substantially constituted by a coil 11 and a coil support 12. The coil support 12 has two opposite end portions 121 and 122, and a coil winding portion 123 at the middle body thereof between both end portions 121 and 122. A recessed portion 124 (shown in FIGS. 3 and 4) is provided at least one end face (121) of both opposite ends 121 and 122. The coil support 12 used in this embodiment is a core formed by ferrite magnetic material and shaped like a drum having flanges at two opposite end portions 121 and 122.

Figure 2:
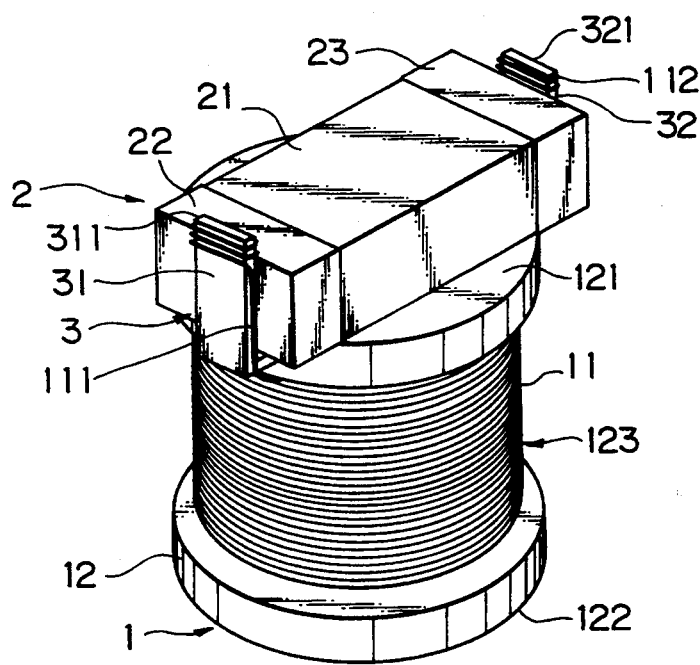
FIG. 2 is a perspective view showing another embodiment of a composite component according to the present invention.
Figure 3:
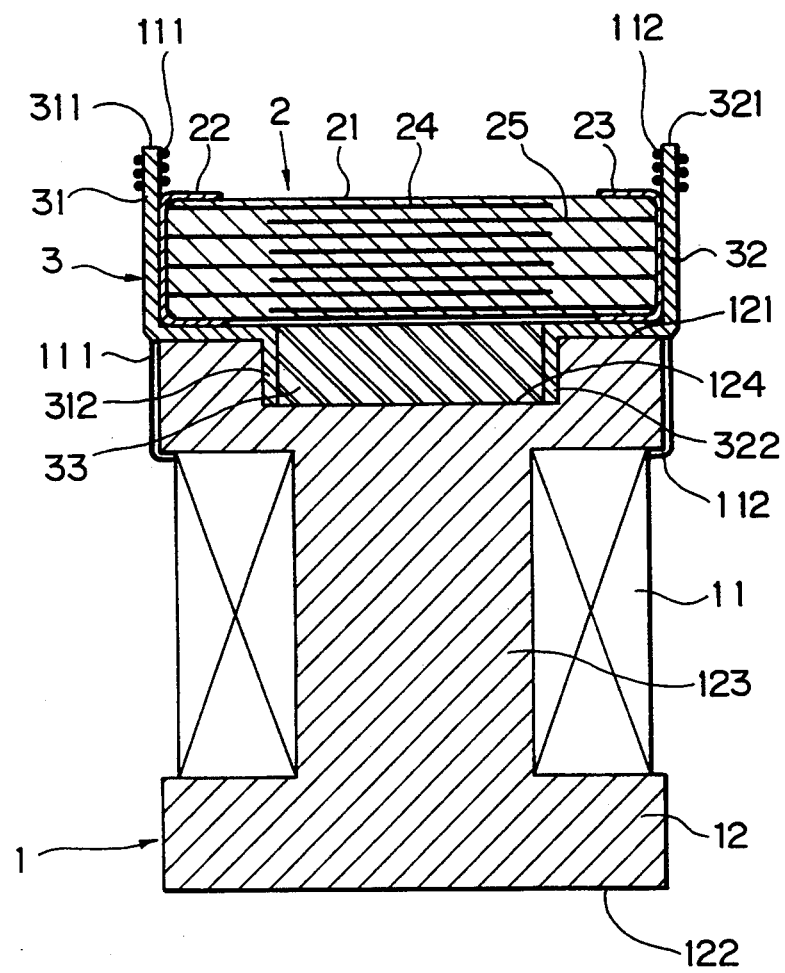
FIG. 3 is a front sectional view of the composite component shown in FIGS. 1 and 2.

The circuit component 2 is a chip component having electrodes 22 and 23 at both opposite end portions of a base body 21. The illustrated circuit component is a capacitor having a plurality of internal electrodes 24 and 25 (FIGS. 3 and 4) in the base body 21 formed by a dielectric. The circuit component 2 may be a resistor or other element different from the capacitor. One or more circuit components 2 may be provided. FIG. 1 shows a case in which two circuit components 2 are provided, while FIG. 2 shows a case in which only one circuit component 2 is provided.

The coupling means 3 contains at least a pair of metal pieces 31 and 32. In the case of FIG. 1, two pairs of metal pieces 31 and 32 are mounted to correspond to the two circuit components 2 provided, and in the case of FIG. 2, a pair of metal pieces 31 and 32 are mounted to correspond to the one circuit component 2 provided.

Figure 4:
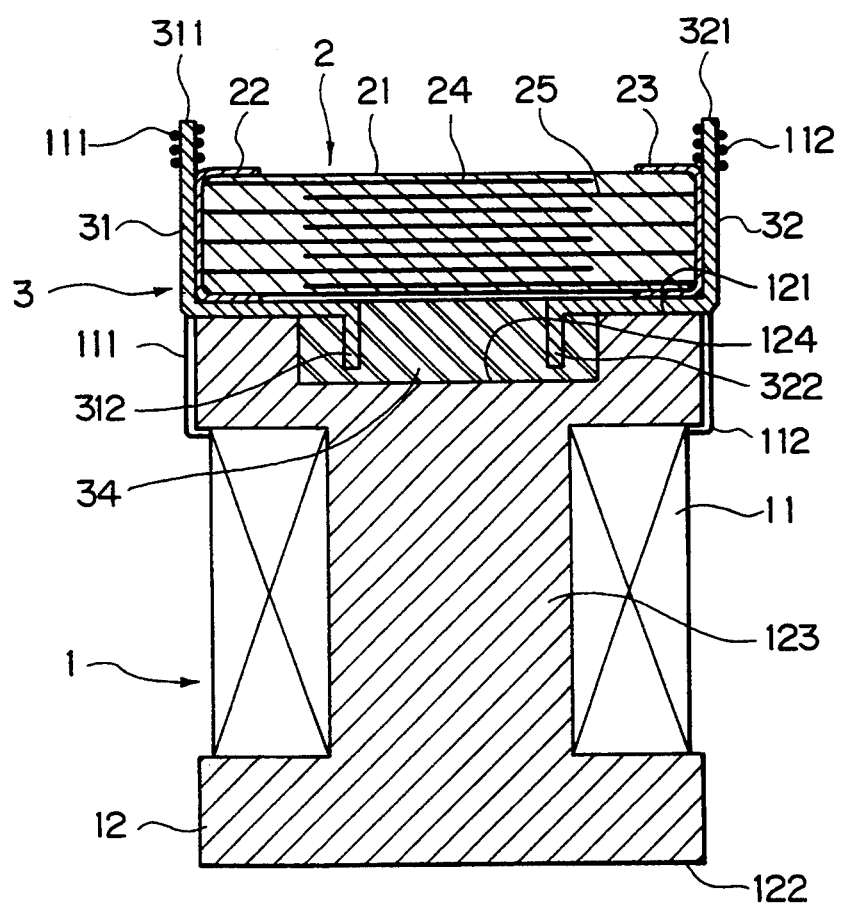
FIG. 4 is a front sectional view in another structural example of the composite device shown in FIGS. 1 and 2.

One end portions 312 and 322 of the pair of metal pieces 31 and 32 are fixed in the recessed part at the end portion 121 of the coil support 12, and the other end portions 311 and 321 thereof are arranged to face with each other across a space. In the embodiment shown in FIG. 3, the recessed part 124 is filled with an adhesive 33 so as to fix the metal pieces 31 and 32 in the recessed part 124. Besides this assembled structure, it is possible to use a structure, as shown in FIG. 4, that the end portions 312 and 322 of the metal pieces 31 and 32 are buried in an insulating support 34, and this insulating support 34 is inserted into and mounted to the recessed part 124 of the coil support 12.

The circuit component 2 is disposed between the end portions 311 and 321 of the metal pieces 31 and 32, and the electrodes 22 and 23 thereof are respectively fixed to the metal pieces 31 and 32 by means of soldering, for example. Therefore, the circuit component to be combined with the inductor 1 is Joined with the inductor 1 at the top of the inductor without using a circuit board or the like. Because of this structure, a small-size composite component having a fewer number of parts can be obtained.

The coil support 12 which is a component part of the inductor 1 is in a drum shape having two opposite end portions 121 and 122 and also having a coil winding portion 123 at the middle body thereof between the two opposite end portions 121 and 122. To the end face of one end portion 121 of the coil support 12, the circuit component 2 is attached by using the pair of metal pieces 31 and 32. Therefore, this composite component can be produced with a thin and small-size structure to an extent of thickness substantially determined by the length of the axial direction of the coil support 12 and by the thickness of the circuit component 2.

The metal pieces 31 and 32 may be used as electrical terminals connecting the ends 111 and 112 of the coil 11. The ends 111 and 112 of the coil 11 may be wound around the metal pieces 31 and 32 to which the electrodes 22 and 23 of the circuit component 2 are electrically connected. Exclusive-use metal pieces provided independently of the circuit component 2 may be used for connection with the ends 111 and 112 of the coil 11.

The composite component according to the present invention can be used by mounting it as a discrete part on a circuit board, for example, or can be used by enclosing it in a housing. When it is used as a discrete part, the side where the circuit component 2 exists is the side where the composite component is to be mounted, and the metal pieces 31 and 32 can be used as terminals for mounting.

Figure 5:
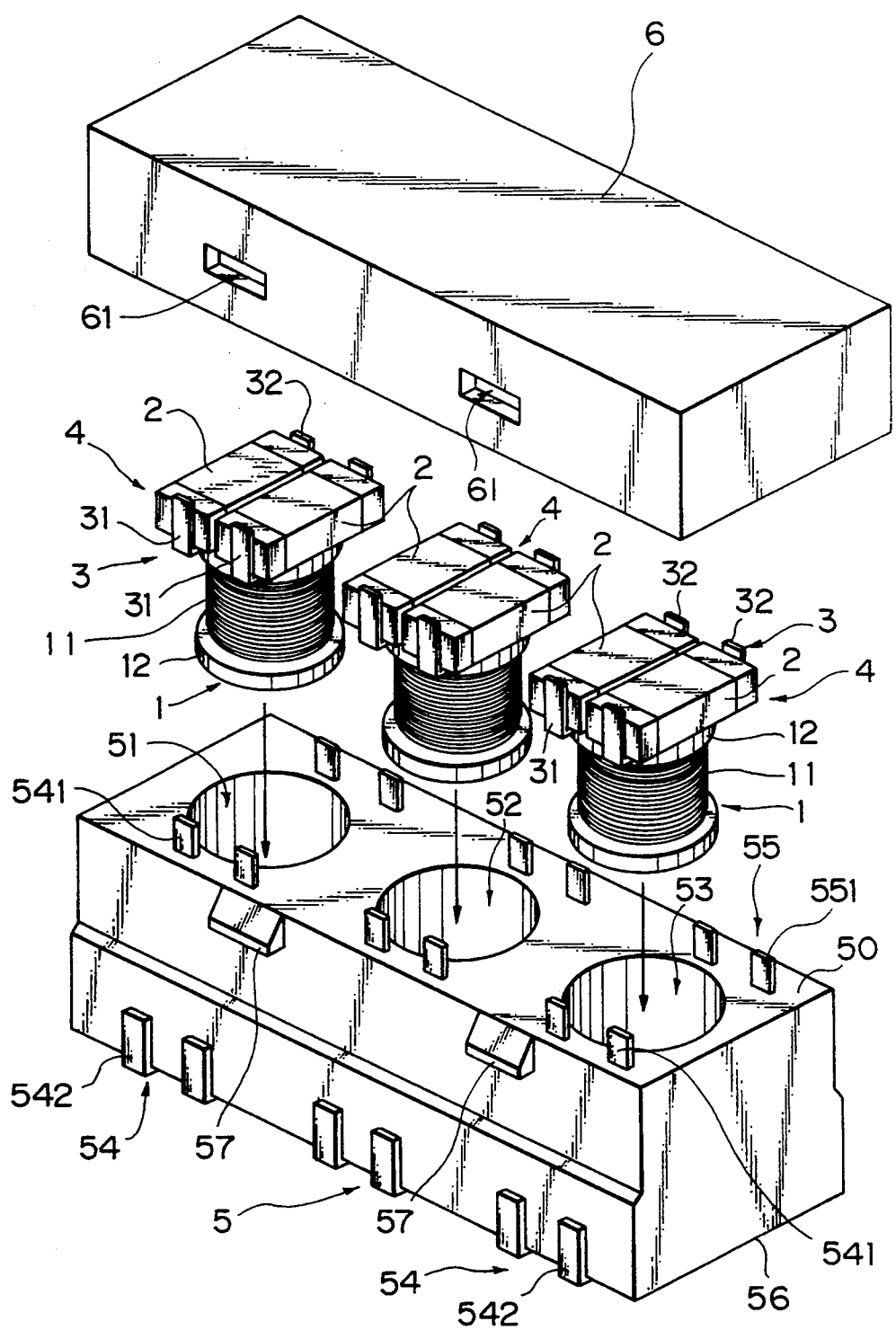
FIG. 5 is an exploded view in perspective showing an embodiment of a composite device according to the present invention.
Figure 6:
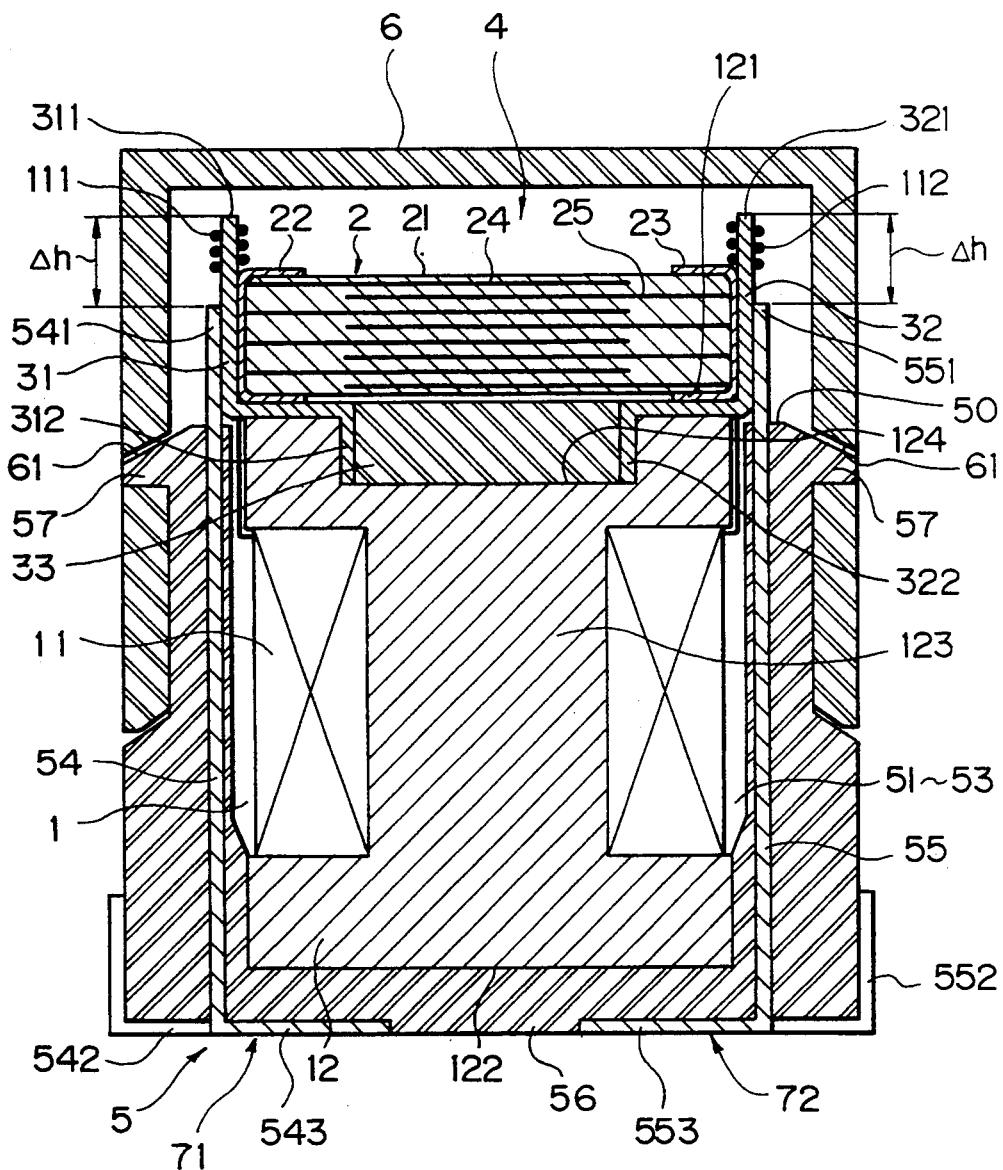
FIG. 6 is a sectional view of the composite device shown in FIG. 5.
Figure 7:
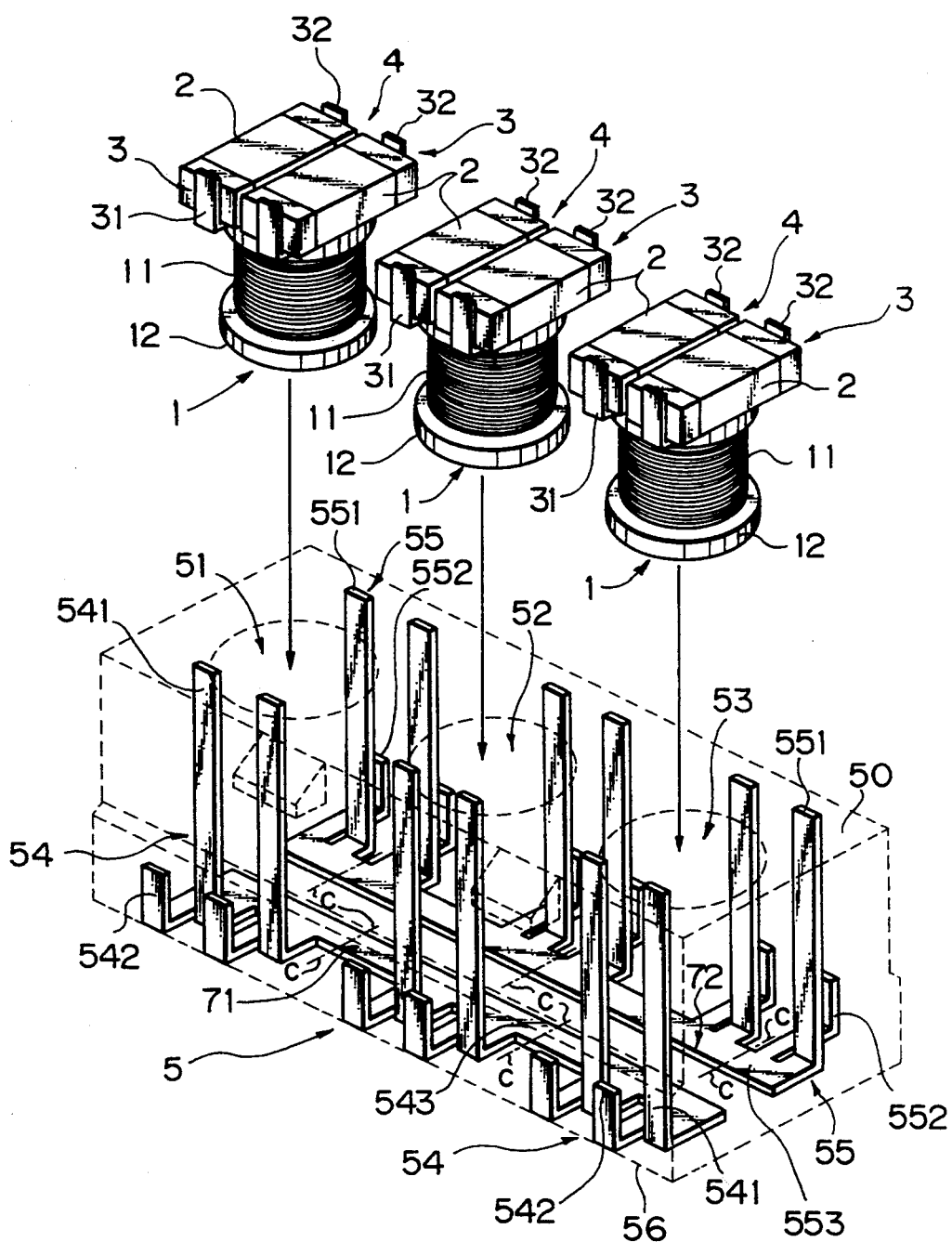
FIG. 7 is a transparent perspective view of a housing of the composite device shown in FIGS. 5 and 6.

Referring to FIGS. 5 to 7, the composite device according to the present invention will be described. In FIGS. 5 to 7, reference numeral 4 denotes the composite component, 5 a housing formed by an insulating resin for example, and 6 a housing cover.

A plurality of the composite components 4, in this case three composite components 4, are provided. The housing 5 has component holding sockets 51 to 53 open to the atmosphere at one side face 50 of the housing 5, and their number corresponds to the quantity of the composite components 4. The composite components 4 are accommodated respectively in the component holding sockets 51 to 53. In the assembly process, only by inserting the composite components 4 into the respective component holding sockets 51 to 53 of the housing 5, the composite components 4 can be certainly positioned at specified positions. This makes the assembly work of the composite component very easy. In addition, the composite device has a standardized external shape determined by the external shape of the housing 5, so that it is possible to provide a composite device with high dimensional accuracy.

Since the composite components 4 are inserted in the component holding sockets 51 to 53, the position and the direction of these composite components 4 are fixed by the component holding sockets 51 to 53 at all times. Consequently, the electrical characteristics are less liable to change caused by a change in the position or the direction of the inductor 1, thereby securing substantially fixed stable characteristics.

The composite components 4 are mounted such that the coil support sides thereof are located in the component holding sockets 51 to 53, and that the circuit components 2 are located outside the housing 5. By this arrangement, it is possible to perform processes such as electrode trimming or the like on the circuit components 2.

Terminals 54 and 55 are provided at suitable intervals on the thick portion of the housing S. Referring to FIGS. 6 and 7, it will be understood that the one end portions 541 and 551 of the respective terminals 54 and 55 are arranged so as to protrude from one face 50 of the housing 5. The other end portions 542 and 552 of the terminals 54 and 55 are drawn out from the opposite face 56, that is, tile bottom face of the housing 5. The drawn-out end portions 542 and 552 are bent to have a face substantially flush with the face 56, and the ends thereof are bent to extend along the side face of the housing 5.

The portions of the terminals 54 and 55, which appear in the same face as the bottom face 56 of the housing 5 are continuously connected respectively by connecting parts 543 and 553, but may be separated according to a required circuit configuration. For example, the terminals 54 and 55 may be separated by providing slits at positions c (see FIG. 7) to be separated depending upon the circuit configuration. In the manner as described, wiring circuit patterns 71 and 72 by the terminals 54 and 55 can be formed.

Since the wiring patterns 71 and 72 appear on the bottom face 56, the wiring condition by the terminals 54 and 55 can be known by looking at the bottom face 56 from outside. The wiring patterns 71 and 72 will be different from each other in accordance with the type and the direction of the composite device. Therefore, the type of the composite device or the direction thereof can be identified by looking at the wiring condition as mentioned above, and thus wrong device insertion or wrong wiring can be prevented when the circuit is mounted. The patterns 71 and 72 can be identified not only by the human eye but also by such as a pattern recognition system. Thus, the composite devices can be classified automatically in accordance with the type thereof and furthermore can be arranged in a specified direction by using the pattern recognition system. Because the patterns 71 and 72 of the terminals 54 and 55 are formed in substantially the same plane with the bottom face 56, the installation stability is improved when the composite components are mounted.

As the lead frame material in the case that a housing 5 is formed by molding on a lead frame having divided lead strips (terminals 54 and 55), a phosphor bronze plate, for example, is suitable. For each of the composite component 4, one set of the terminals 54 and 55, each of which terminals is constituted by two lead strips, are provided. Therefore, for the composite device, a plurality of sets of the terminals 54 and 55 are provided.

The cover 6 for the housing 5 is formed by an insulating resin as well as the housing 5 in this embodiment, and is mounted to the housing 5 so as to cover the face 50 thereof. Therefore, an insulating resin need not be filled in the surrounding area of the composite components 4 inserted in the component holding sockets 51 to 53 of the housing 5. For this reason, the electrical characteristics are not subject to change or deterioration caused by the cure shrinkage stress of the insulating resin. In order to couple the cover 6 with the housing 5, there are provided projections 57 on the side faces of the housing 5, and indentations 61 in the cover at locations corresponding to projections 57 of the housing. By an engaging and fixing mechanism such as the projections 57 and the indentations 61, the cover 6 is fitted securely on the housing 5.

The ends 311 and 321 of the metal pieces 31 and 32 of each composite component 4 are set such that they protrude higher than the ends 541 and 551 of the terminals 54 and 55 of the housing 5 when the composite components 4 are accommodated in the housing 5. The end portions 111 and 112 of the coil 11 are wound within the area of $\Delta h$ in the end portions 311 and 321 of the metal pieces 31 and 32 (see FIG. 6). Thus, the wound portions of the end portions 111 and 112 of the coil 11 are prevented from being broken by abrasion with the terminals 54 and 55 when the composite components 4 are inserted into the component holding sockets 51 to 53.

Figure 10:
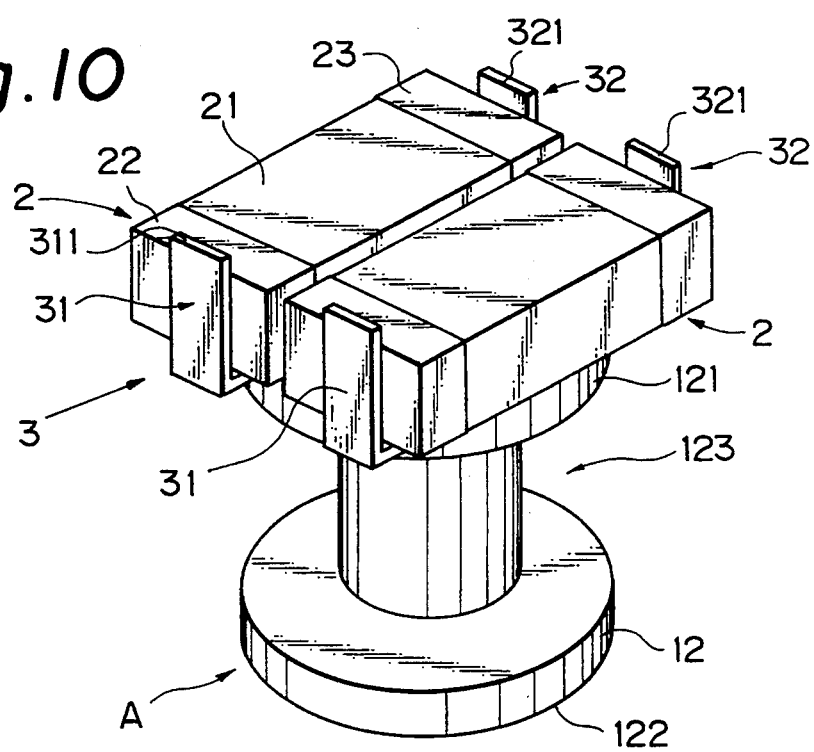
FIG. 10 is a perspective view of a composite component obtained through the processes of FIGS. 8 and 9.
Figure 11:
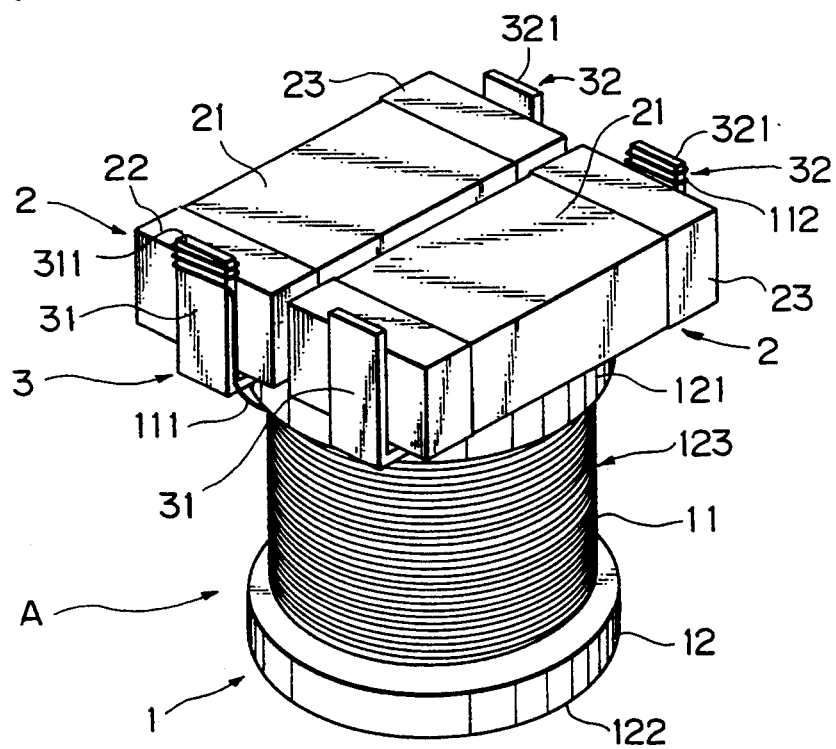
FIG. 11 is a perspective view of a composite component after winding a coil on the composite component shown in FIG. 10.
Figure 12:
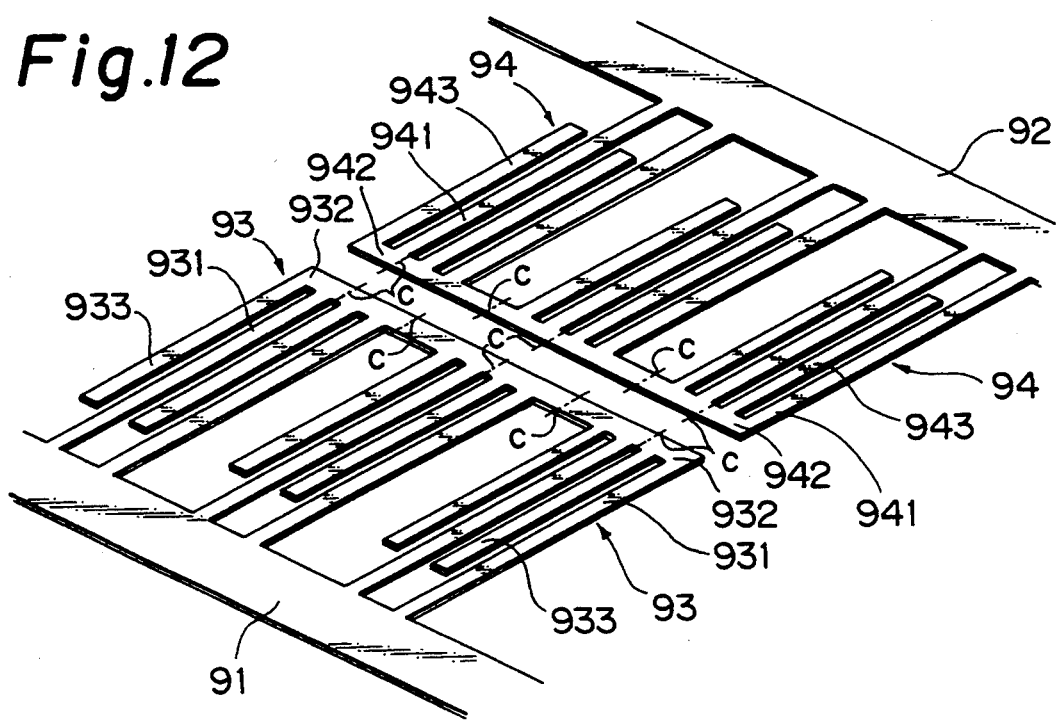
FIG. 12 is a perspective view of a lead frame used in a housing producing process according to the present invention.
Figure 13:
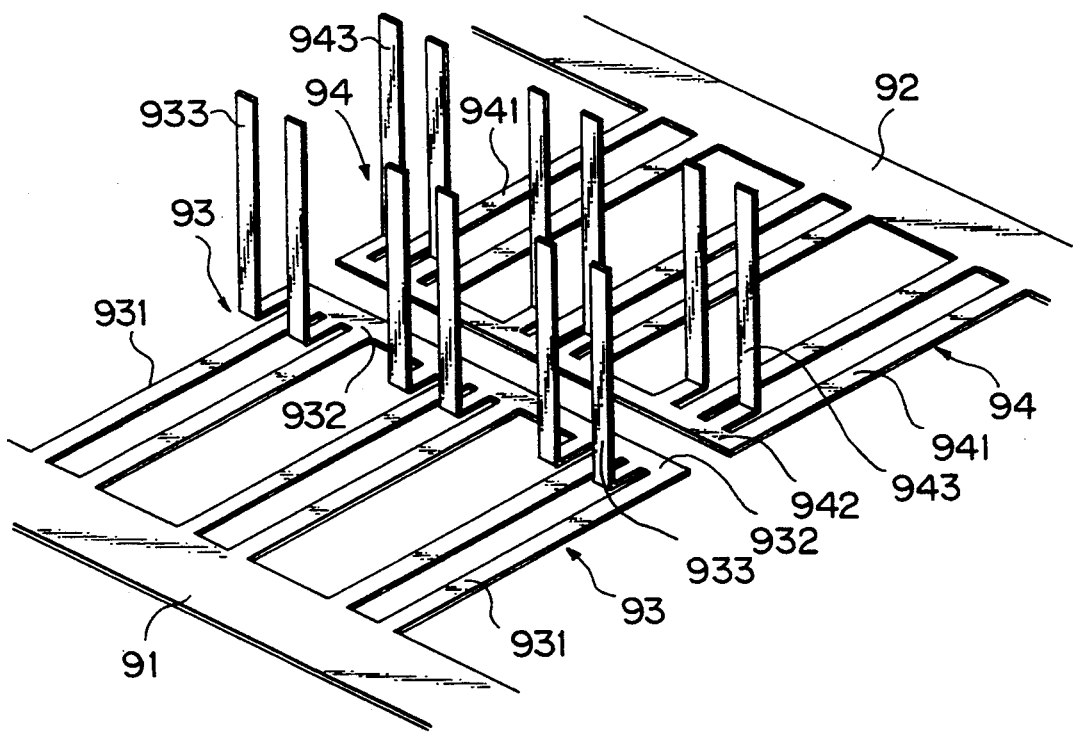
FIG. 13 is a perspective view showing a forming process of the lead frame shown in FIG. 12.
Figure 14:
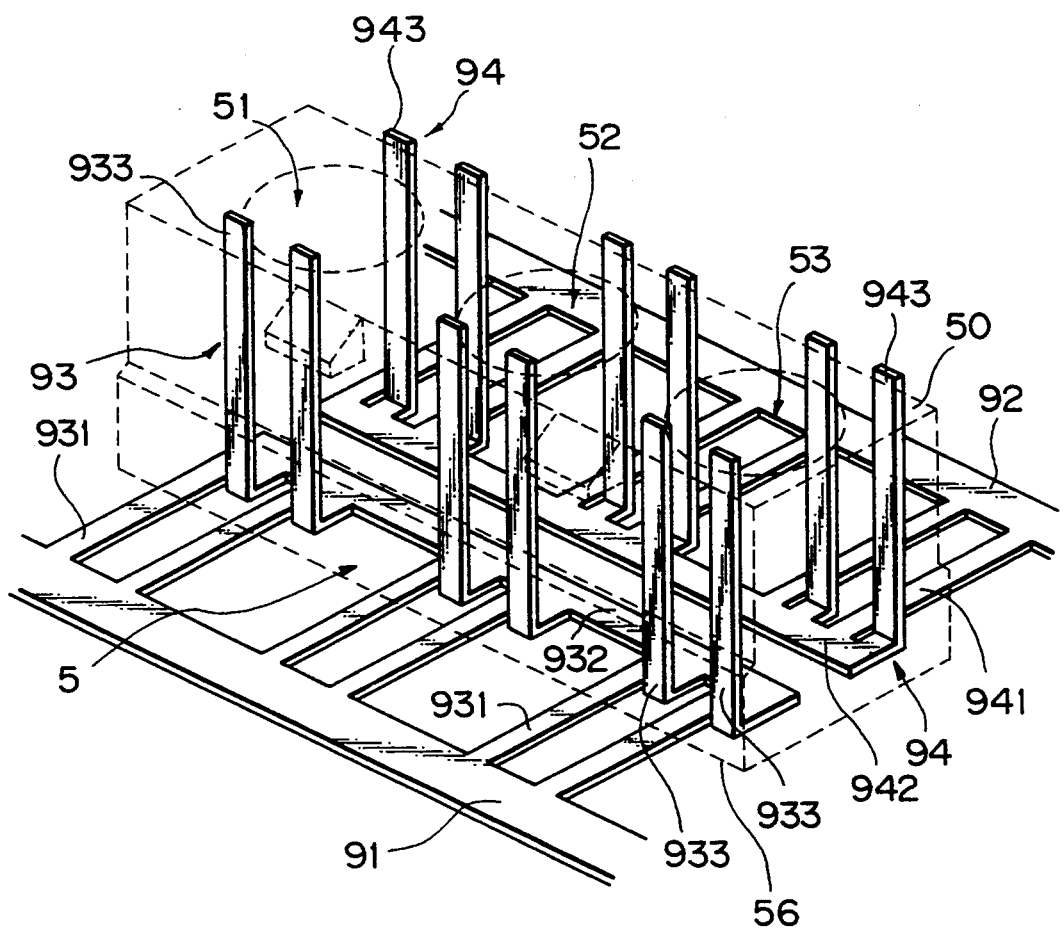
FIG. 14 is a perspective view showing a molding process for molding a housing to the lead frame shown in FIG. 13.
Figure 15:
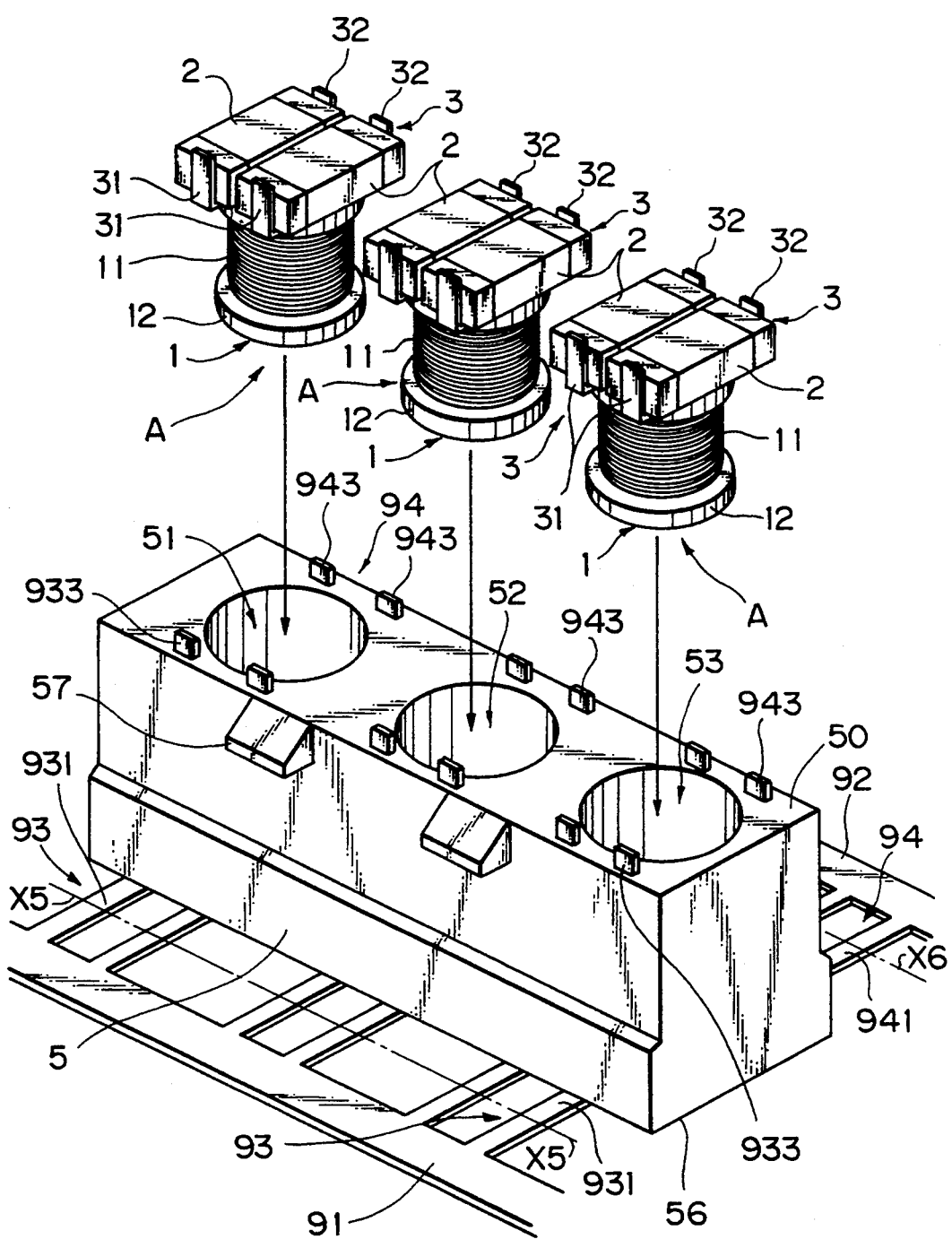
FIG. 15 is a perspective view showing a mounting process for mounting the composite components to the housing obtained by the process of FIG. 14.
Figure 16:
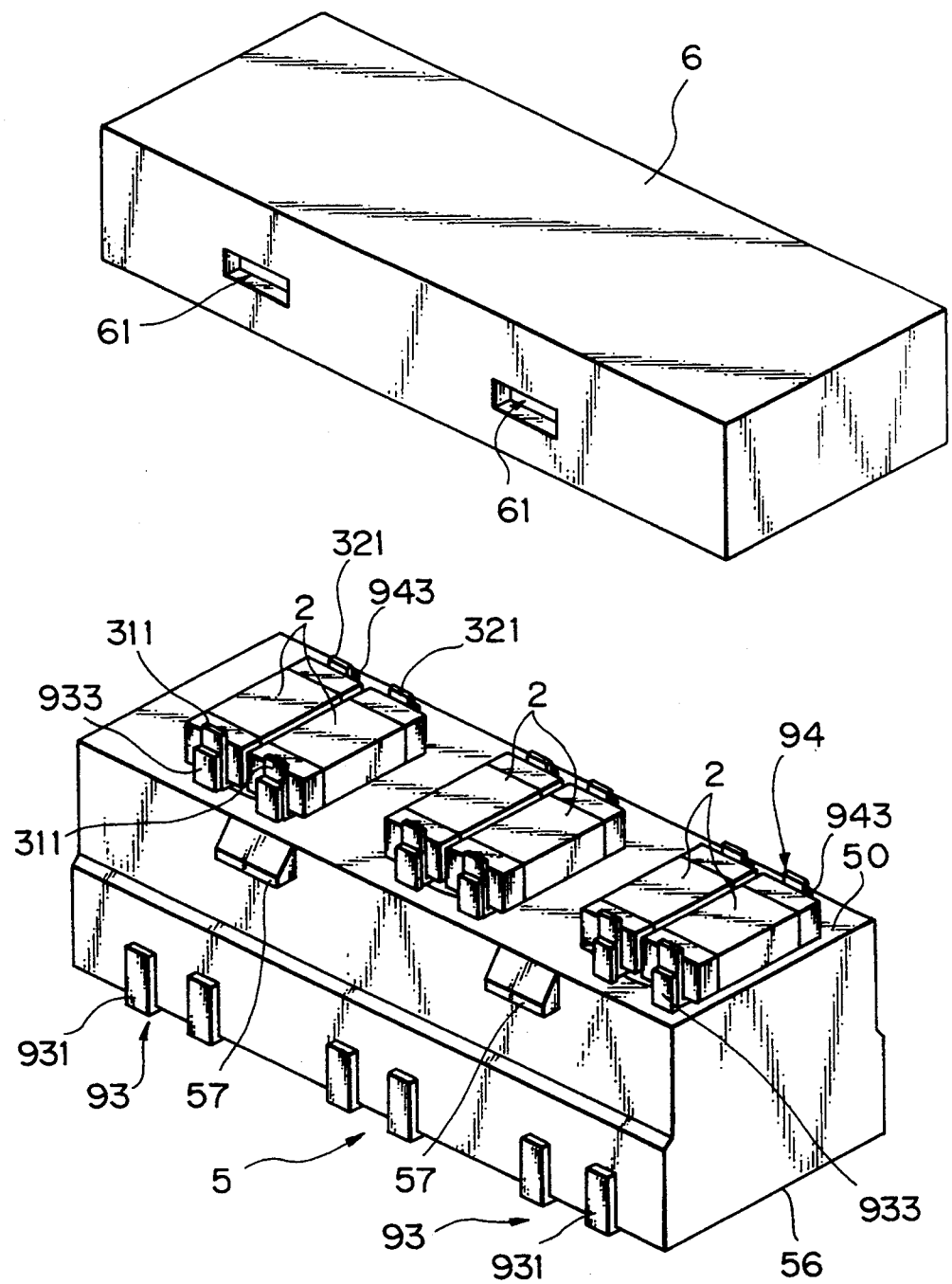
FIG. 16 is a final assembly process according to the present invention.

Referring to FIGS. 8 to 16, a method of producing a composite device according to the present invention will next be described. In these figures, FIGS. 8 to 11 show a composite component producing process, FIGS. 12 to 14 show a housing producing process, and FIGS. 15 and 16 show a mounting process.

Figure 8:
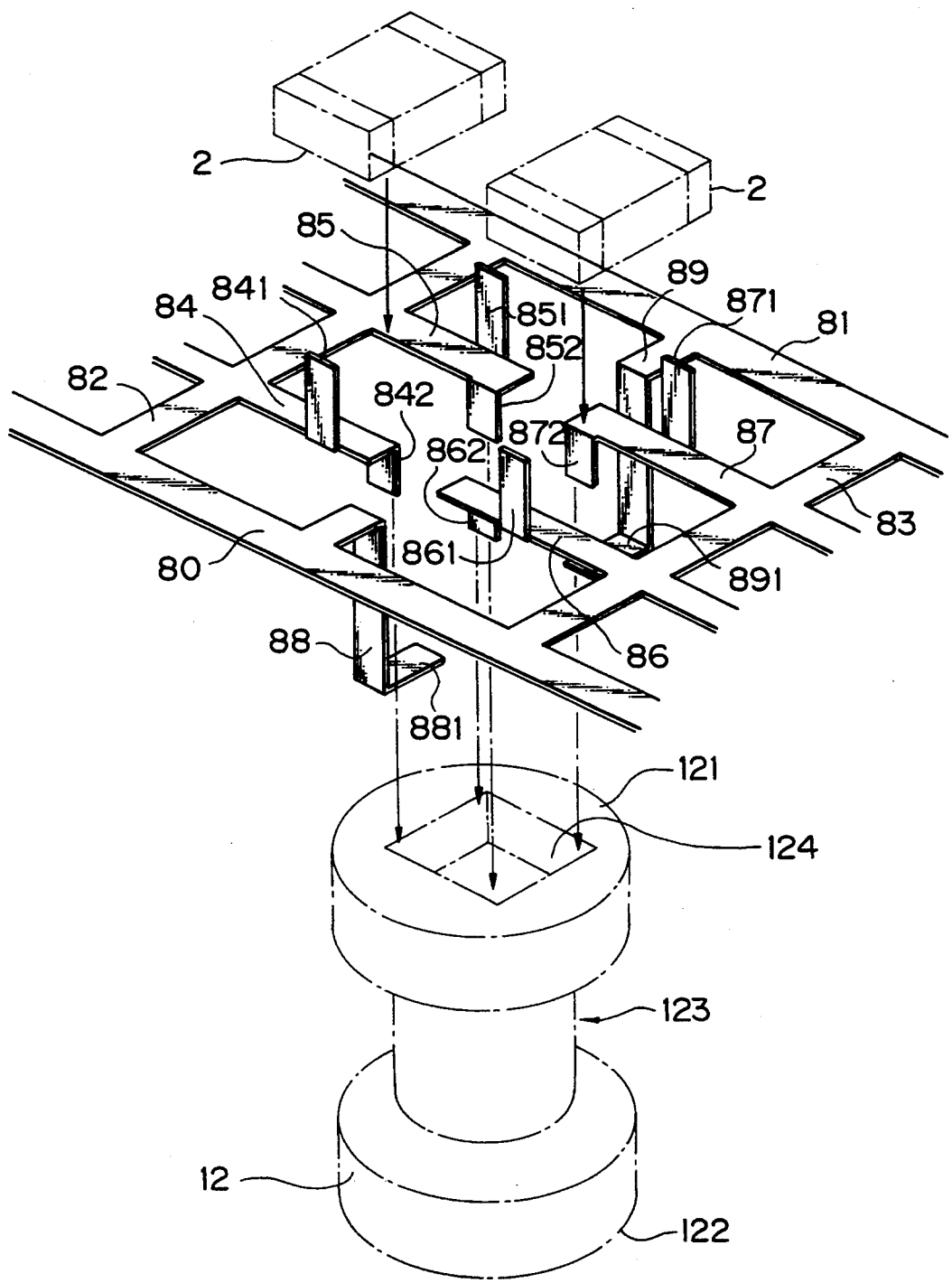
FIG. 8 is a perspective view of a lead frame used in a composite component production process according to the present invention.

In FIG. 8, reference numerals 80 to 83 denote frame portions, 84 to 87 first arm pieces, and 88 and 89 second arm pieces. Those metal pieces are formed by, for example, a press work on a long metal thin plate. An example of a metal thin plate is of phosphor bronze.

As the first arm pieces, it is necessary to provide at least a pair of those pieces. In the example of FIG. 8, there are two pairs of first arm pieces 84 to 87. A pair of the first arm pieces 84 and 85 on one side are located apart from each other. One ends of the first arm pieces 84 and 85 are connected to the frame portion 82, and the other ends thereof respectively have first bent pieces 841 and 851 and second bent pieces 842 and 852. The first bent pieces 841 and 851 are bent in the same direction with each other, and face to each other across a space. The second bent pieces 842 and 852 are bent in the direction opposite to the direction of the first bent pieces 841 and 851, and face to each other across a space. The other pair of first arm pieces 86 and 87 have first bent pieces 861 and 871 and second bent pieces 862 and 872, structured in the same manner as these of the above-mentioned pair of the first arm pieces 84 and 85.

As the second arm pieces 88 and 89, at least one pair of those pieces is necessary to be provided. One ends of the second arm pieces 88 and 89 are connected to the frame portions 80 and 81. The other ends of the second arm pieces 88 and 89 are bent in the direction opposite to the direction of the first bent pieces 841, 851, 861, and 871, face to each other across a space, and have hook members 881 and 891 at their distal ends. In another embodiment, the second arm pieces 88 and 89 may be formed at positions connected to the frame portions 82 and 83.

A circuit component 2 is inserted in the space between the first bent pieces 841 and 851 from the upside of the thus formed lead frame. Then, a coil support 12 of the inductor 1 is mounted from the underside opposite the side of the lead frame where the circuit component 2 is fitted. On the mounting end surface of the coil support 12, there is provided in advance a recessed part 124. In this recessed part, the second bent pieces 842, 852, 862, and 872 are inserted, and the coil support 12 is held by the hook members 881 and 891 provided at the distal ends of the second arm pieces 88 and 89.

As mentioned above, since the circuit components 1 and 2 are mounted from both sides (upside and underside) of the lead frame, the assembly work is made easy and it is possible to adopt an automatic assembly process. The second bent pieces 842, 852, 862, and 872 are fixed, by for example an adhesive in the recessed part 124, to the coil support 12. Simultaneously, the underside of the circuit component 2 is fixed temporarily to the lead frame by an adhesive. Since the first arm pieces 84 to 87 are continuously connected to the second bent pieces 842, 852, 862, and 872, these first arm pieces 84 to 87 which also serve as electrical lead terminals are used as positioning and fixing pieces along with the second bent pieces 842, 852, 862 and 872. Namely, one lead frame performs two roles of lead terminal segments and the positioning and fixing pieces, so that it is not necessary to provide exclusive-use lead terminal segments or positioning and fixing pieces.

Figure 9:
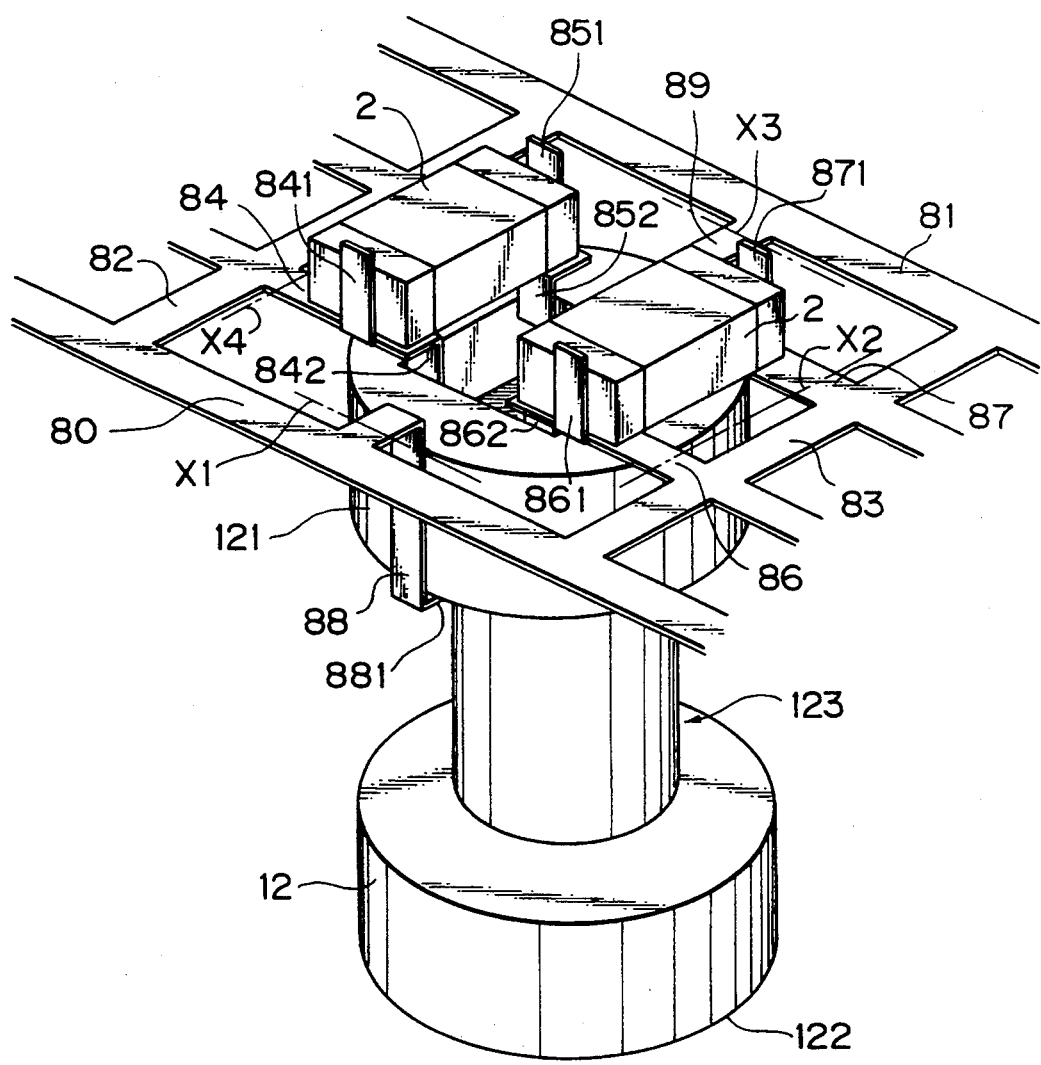
FIG. 9 is a perspective view showing a mounting process for mounting circuit components to the lead frame shown in FIG. 8.

After the coil support 12 for the Inductor 1 and the circuit component 2 are mounted and fixed on the lead frame, the lead frame is cut at cutting positions X1 to X4 (see FIG. 9).

Consequently, a composite component A, shown in FIG. 10, which is made by uniting the circuit components 1 and 2 through the first bent pieces 841, 851, 861, and 871 (311 and 321) and the second bent pieces 842, 852, 862, and 872 (312 and 322) of the first arm pieces 84 to 87, respectively, can be obtained.

Subsequently, by winding a coil 11 on the coil support 12 and performing a coil terminal treatment, a composite component as shown in FIG. 11 can be obtained. The end portions 111 and 112 of the coil 11 are wound around the end portions of the first bent pieces 311 and 321 (841, 851, 861, and 871) electrically connected to the electrodes 22 and 23 of the circuit component 2. Pieces of the first bent pieces 311 and 321 (841, 851, 861 and 871) to which pieces the coil ends 111 and 112 are respectively to be connected is determined by a required circuit configuration. Brazing or soldering the coil ends 111 and 112 to the first bent pieces 311 and 321 (841, 851, 861 and 871) may be carried out at this stage, but from tile viewpoint of improvement of workability and mass-production efficiency the brazing or soldering should preferably be done in the process of mounting the composite components into the housing as described later.

The housing producing process will next be described with reference to FIGS. 12 to 14. FIG. 12 shows a lead frame used in the housing producing process, FIG. 13 shows the forming process of a lead frame, and FIG. 14 shows the molding process of the housing.

In FIG. 12, reference numerals 91 and 92 denote a pair of substantially parallel frame portions separated a certain distance, and 93 and 94 denote lead terminal segments which are formed in a continuous metal thin plate. A typical example of usable metal thin plate is phosphor bronze.

The lead terminal segments 93 and 94 have first terminal portions 931 and 941, connecting portions 932 and 942, and second terminal portions 933 and 943, respectively. The illustrated lead terminal segments 93 and 94 are provided on the frame portions 91 and 92.

There are a plurality of lead terminal segments 93 mutually spaced in the longitudinal direction of the frame portion 91. One ends of the first terminal portions 931 are continuously connected to the inner end of the frame portion 91, and from these positions, the terminal portions 931 extend in the direction of the frame portion 92. The other end of the terminal portions 931 are located at substantially intermediate positions between the frame portions 91 and 92. One ends of the connecting portions 932 are continuously connected to the other end of the first terminal portion 931. From these positions, the connecting portions 932 extend along the longitudinal direction of the frame portions 91 and 92. One ends of the second terminal portions 933 are continuously connected to the other ends of the respective connecting portions 932, and from these positions, the terminal portions 933 extend in the direction of the frame portion 91 while keeping a specified space in relation to the first terminal portions 931. The other ends of the terminal portions 933 are free ends.

The lead terminal segment 94 is of the same structure as the lead terminal segment 93. More specifically, one ends of the first terminal portions 941 are continuously connected to the inner end of the frame portion 92, and from these positions, the terminal portions 941 extend in the direction of the frame portion 91. The other end of the terminal portions 941 are located at substantially intermediate positions between the frame portions 91 and 92. One ends of the connecting portions 942 are continuously connected to the other end of the first terminal portion 941. From these positions, the connecting portions 942 extend along the longitudinal direction of the frame portions 91 and 92. One ends of the second terminal portions 943 are continuously connected to the other ends of the respective connecting portions 942, and from these positions, the terminal portions 943 extend in the direction of the frame portion 92 while keeping a specified space in relation to the first terminal portions 941. The other ends of the terminal portions 943 are free ends.

As has been described, one end of each the first terminal portion 931 (941) leads to the inner end of the frame portion 91 (92), and from this position, the first terminal portion 931 (941) is led in the direction of the frame portion 92 (91), and the other end thereof is located between the frame portions 91 and 92. Furthermore, each second terminal portion 933 (943) which leads to the first terminal portion 931 (941) through the connecting portion 932 (942) is led back In the direction of the frame portion 91 (92). Therefore, the distance between the lead terminal segment 93 and 94 can be reduced to the minimum value substantially defined by a space between the first terminal portions 931 and 941. For this reason, the housing can be reduced in size. Even when the lead terminal segments 93 and 94 are positioned so as to face with each other between the frame portions 91 and 92, the distance between the frame portions 91 and 92 has only to be selected considering the sum of the lengths of the first terminal portions 931 and 941, so that the lengths of the second terminal portions 933 and 943 need not be considered. Therefore, the size of the housing can be reduced remarkably.

Across the connecting portions 932 and 942, slits are provided at the positions c where the lead frame is to be cut in accordance with a required circuit configuration. The spaces between the respective adjacent terminal portions of the lead terminal segments 93 and 94 can be arbitrarily determined depending upon the circuit configuration. In modified case, the terminal portions may be equally spaced.

As shown in FIG. 13, in the lead frame forming process, the second terminal portions 933 and 943 are bent upright at appropriate positions, for example, at the junctions between these second terminal portions and the connecting portions 932 and 942. As described above, one ends of the connecting portions 932 and 942 are connected to the other ends of the first terminal portions 931 and 941, and from those positions of Junction, the connecting portions 932 and 942 extend along the longitudinal direction of the frame portions 91 and 92. Furthermore, the other ends of the connecting portions 932 and 942 are connected to the ends on one side of the second terminal portions 933 and 943, while the other ends of the second terminal portions 933 and 943 are left as free ends. Therefore, the above-mentioned forming process can be performed. Even when the lead terminal segments 93 and 94 are provided so as to face with each other between the frame portions 91 and 92, the distance between these lead terminal segments is never changed by the above-mentioned forming.

After the lead frame forming process, in the housing molding process shown in FIG. 14, a housing 5 of an adequate insulating resin is molded on the lead frame. The housing 5 is formed in such a way as to form component holding sockets 51 to 53 to accommodate one or more composite components which have a structure shown in FIGS. 1 to 5 and are made by the producing process shown in FIGS. 8 to 11.

The component holding sockets 51 to 53 are arranged to have an opening a little larger than the external dimension of the coil support 12 as an integral part of the inductor 1. In addition, the second terminal portions 933 and 943 of the lead terminal segments 93 and 94 are designed to protrude from the surface 50 of the housing 5. Further, the housing 5 is molded such that the first terminal portions 931 and 941 and the connecting portions 932 and 942 form a face substantially flush with the bottom surface 56 of the housing 5.

By providing slits at the positions c (see FIG. 6) to be cut in accordance with the required circuit configuration for the connecting portions 932 and 942 in order to subdivide the respective lead terminal segments 93 and 94, the wiring patterns by the connecting portions 932 and 942 can be formed. Since the connecting portions appear on the bottom surface 56 of the housing 5, the wiring conditions of the lead terminal segments 93 and 94 can be checked visually or mechanically according to the positions c of the slits when the bottom surface 56 is inspected from outside, and the type or the direction of the composite devices can be thereby recognized, so that mounting errors can be avoided. Moreover, the lead terminal segments 93 and 94 constitute a face substantially in the same plane with the bottom surface 56, and therefore, the installation stability in mounting composite components can be improved.

After the housing molding process, as shown in FIG. 15, composite components A are inserted into the component holding sockets 51 to 53 of the housing 5, respectively.

When assembling a composite device, only by inserting composite components A into the component holding sockets 51 to 53 of the housing 5, the composite components A can be set at specified positions, so that the assembly work becomes very easy. What is more, the overall external shape of the composite device will be standardized as it is determined by the external shape of the housing 5, by which a composite device with high dimensional accuracy can be obtained. Moreover, since the composite components A are inserted into the component holding sockets 51 to 53, the position and the direction of the composite components A are kept constant by the component holding sockets 51 to 53 at all times, the electrical characteristics are less liable to change by a change in the position or the direction of the inductors, with the result that the stable and substantially fixed electrical characteristics can be secured.

The end portions 311 and 321 of the metal pieces 31 and 32 of a composite component A are set so as to protrude higher than the second terminal portions 933 and 943 of the lead terminal segments 93 and 94. Within the area of height difference between them, the end portions 111 and 112 of the coil 11 are wound. By this arrangement, the wound portions of the terminal ends 111 and 112 of the coil 11 are prevented from being broken by abrasion with the lead terminal segments 93 and 94 when the composite components a are inserted into the component holding sockets 51 to 53.

After this, the wound coil end portions 111 and 112, the second terminal portions 933 and 943, the metal pieces 31 and 32, and the circuit component 2 are soldered together simultaneously. By this soldering, the composite components A are fixed in the component holding sockets 51 to 53.

Then, the first terminal portions 931 and 941 are cut at the cutting positions along the lines X5—X5 and X6—X6, and are subjected to necessary processes, including the first terminal portions 931 and 941 are bent along the side faces of the housing. Thus, a composite device shown in FIG. 16 is obtained.

As shown in FIG. 16, the housing cover 6 is attached to the housing 5 in such a manner as to cover an opened side 50 of the housing 5. Therefore, the surrounding area around the composite components A inserted in the component holding sockets 51 to 53 need not be filled with an insulating resin or the like. For this reason, the electrical characteristics are not subject to change or deterioration owing to the cure shrinkage stress or the like of the Insulating resin.

The advantages by the present invention described are summarized in the following.

(a) a pair of metal pieces as coupling means for connecting the inductor and the capacitor are arranged such that one ends of the metal pieces are fixed to the end face of the coil support and the other ends thereof face with each other across a space. The circuit component is disposed between the metal pieces, and the electrodes are mounted fixedly to the metal pieces. Therefore, the circuit component to be combined with the inductor can be Joined with the inductor at the top of the inductor without using such as a circuit board. As a result, a composite component in a reduced size with a fewer number of parts can be obtained.

(b) The coil support as a component part of the inductor is in a bar or drum shape having two opposite end portions and a coil winding portion at the middle body thereof between the two opposite end portions. Having a circuit component mounted at the one end portion thereof using a pair of metal pieces, the composite component can be produced in a thin and small structure to an extent of thickness substantially determined by the length in the axial direction of the coil support and the thickness of the circuit component.

(c) The coupling means includes at least a pair of metal pieces that can be made from a lead frame. Therefore, by using such the lead frame, the inductor and the circuit component can be put together. As a result, a composite component highly suitable for mass-production can be obtained.

(d) The housing has component holding sockets which open on one face thereof, and the composite components have their coil support sides which are inserted in the component holding sockets. Therefore, the composite components are kept in the constant position and direction at all times, and the electrical characteristics are least likely to change by a change of the position and the direction of the inductor, so that a composite device with the substantially fixed, stable electrical characteristics can be provided.

(e) In the assembling work, it is only necessary to insert composite components in the component holding sockets of the housing, so that a composite device assembled easily can be provided.

(f) The overall shape is a standardized shape determined by the external configuration of the housing, which makes it possible to provide a composite device with high dimensional accuracy.

(g) The production method according to the present invention comprises a composite component producing process, a housing producing process, and an assembly process. The composite component producing process is a step in which inductors and circuit components are mounted and fixed on the upside and the underside of a lead frame. Subsequently, the lead frame is cut in the region having the circuit components to thereby obtain separate composite components. In the housing producing process, a housing is molded on the lead frame, and in the assembly process, the above-mentioned composite components are accommodated in the housing. Therefore, by this production method, stable electrical characteristics can be obtained, and a composite device having an external shape with high dimensional accuracy can be produced with high mass-production efficiency.

It is claimed:

1. A composite component comprising:
   an inductor having a coil support and a coil, said coil support including two opposite end portions and a coil winding portion between said two opposite end portions, said coil being wound on said coil winding portion;
   a coupling means including at least one pair of metal pieces arranged such that one end of said metal pieces is fixed to one of said two opposite end portions of said coil support and the other ends of said metal pieces face with each other across a space; and
   at least one circuit component which is different from said inductor, said circuit component being a chip component having electrodes at two opposite ends thereof and being disposed between said metal pieces, said electrodes being fixed to said metal pieces.

2. A composite component as claimed in claim 1, wherein said coil support has a recessed portion at one end face thereof, and wherein said one ends of said metal pieces are fixed to said coil support at said recessed portion.

3. A composite component as claimed in claim 1, wherein said circuit component is a capacitor.

4. A composite component as claimed in claim 1, wherein only one of said circuit component is provided.

5. A composite component as claimed in claim 1, wherein two of said circuit components are provided.

6. A composite component as claimed in claim 1, wherein said coil support is a core.

7. A composite component as claimed in claim 6, wherein said core is made of ferrite magnetic material.

8. A composite device comprising:
   at least one composite component which is provided with an inductor having a coil support and a coil, said coil support including two opposite end portions and a coil winding portion between said two opposite end portions, said coil being wound on said coil winding portion, a coupling means including at least one pair of metal pieces arranged such that one end of said metal pieces is fixed to one of said two opposite end portions of said coil support and the other ends of said metal pieces face with each other across a space, and at least one circuit component which is different from said inductor, said circuit component being a chip component having electrodes at two opposite ends thereof and being disposed between said metal pieces, said electrodes being fixed to said metal pieces; and
   a housing having at least one component holding socket at one face thereof, in said at least one holding socket said at least one composite component is mounted.

9. A composite device as claimed in claim 8, wherein said composite component has a coil support side to which side one end portion of said coil support is fixed, and wherein said coil support side is inserted in said component holding socket.

10. A composite device as claimed in claim 8, wherein said device has a plurality of said composite components, and wherein said housing has a plurality of said component holding sockets as many as the number of said composite components.

11. A composite device as claimed in claim 8, wherein said housing has terminals protruding from said one face thereof, and wherein said metal pieces of said composite component face to said terminals of said housing and are electrically connected to said terminals on said one face of said housing.

12. A composite device as claimed in claim 11, wherein said composite component is inserted in said component holding socket so that said other ends of said metal pieces protrude higher than ends of said terminals to provide a height difference between them, and wherein end portions of said coil are connected to said metal pieces within an area of said height difference existing on said metal pieces.

13. A composite device as claimed in claim 11, wherein said terminals are provided for each of said component holding sockets, are led from said one face to an opposite face of the housing, are drawn out from said opposite face, and are bent to form a face substantially the same plane with said opposite face, a part of the terminals appearing on said opposite face forming a wiring pattern.

14. A composite device as claimed in claim 8, wherein said housing includes a housing cover which is attached to said housing so as to cover said one face of said housing.

* * * * *

UNITED STATES PATENT AND TRADEMARK OFFICE
CERTIFICATE OF CORRECTION

PATENT NO. : 5,402,321
DATED : March 28, 1995
INVENTOR(S) : Izu, et. al.

It is certified that error appears in the above-indentified patent and that said Letters Patent is hereby corrected as shown below:

Title page, item [30]

line 4, remove -- Jun. 12, 1991 [JP] Japan....3-156552 --.

after line 5, (Jun. 12, 1991 [JP] Japan....3-167551) add -- Jun. 12, 1991 [JP] Japan........3-167552 --.

Signed and Sealed this

Thirtieth Day of January, 1996

Attest:

BRUCE LEHMAN

*Attesting Officer*  *Commissioner of Patents and Trademarks*